United States Patent
Bueti et al.

(10) Patent No.: US 7,865,789 B2
(45) Date of Patent: Jan. 4, 2011

(54) SYSTEM AND METHOD FOR SYSTEM-ON-CHIP INTERCONNECT VERIFICATION

(75) Inventors: Serafino Bueti, Waterbury, VT (US);
Adam Courchesne, Belchertown, MA (US); Kenneth J. Goodnow, Essex Junction, VT (US); Gregory J. Mann, Winfield, IL (US); Jason M. Norman, Essex Junction, VT (US); Stanley B. Stanski, Essex Junction, VT (US); Scott T. Vento, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 11/819,748

(22) Filed: Jun. 28, 2007

(65) Prior Publication Data

US 2008/0215945 A1    Sep. 4, 2008

Related U.S. Application Data

(63) Continuation of application No. 10/906,388, filed on Feb. 17, 2005, now Pat. No. 7,313,738.

(51) Int. Cl.
*G01R 31/28* (2006.01)

(52) U.S. Cl. ................. 714/724; 714/25; 714/30; 714/31; 714/32; 714/43; 714/45; 714/56; 714/741; 714/48; 714/716; 714/717; 714/712; 714/709; 714/715; 714/726; 714/728; 714/733; 714/738; 714/739; 714/718; 702/108; 702/118; 703/14; 703/15; 703/21; 703/22; 365/201

(58) Field of Classification Search .................. None
See application file for complete search history.

(56) References Cited

U.S. PATENT DOCUMENTS

| | | | |
|---|---|---|---|
| 3,315,228 A | 4/1967 | Futerfas et al. | |
| 5,228,042 A * | 7/1993 | Gauthier et al. | ............. 714/716 |
| 5,726,991 A | 3/1998 | Chen et al. | |
| 6,002,714 A | 12/1999 | Huscroft | |
| 6,477,674 B1 | 11/2002 | Bates et al. | |
| 6,553,530 B1 | 4/2003 | Kim | |
| 6,754,867 B2 | 6/2004 | Ojha et al. | |
| 6,760,873 B1 | 7/2004 | Hao et al. | |
| 6,816,987 B1 | 11/2004 | Olson et al. | |
| 6,834,368 B2 | 12/2004 | Nozuyama | |
| 7,080,302 B2 * | 7/2006 | Takagi | .......................... 714/734 |
| 2002/0040459 A1 | 4/2002 | Watanabe et al. | |

(Continued)

*Primary Examiner*—John P Trimmings
(74) *Attorney, Agent, or Firm*—McGinn Intellectual Property Law Group, PLLC (57) ABSTRACT

A system and method for verifying system-on-chip interconnect includes a first linear feedback shift register coupled to an output interface of a first system-on-chip component, a second linear feedback shift register instantiated in a second system-on-chip component, and a comparator coupled to the second linear feedback shift register and the input interface of the second system-on-chip. Another method for verifying includes generating a pseudo-random number sequence with the first linear feedback shift register and the second linear feedback shift register using an identical first initial state, and comparing an output of the first linear feedback shift register with an output of the second linear feedback shift register and reporting a miss-compare.

18 Claims, 12 Drawing Sheets

U.S. PATENT DOCUMENTS

2003/0070126 A1    4/2003  Werner et al.
2003/0093730 A1*   5/2003  Halder et al. ............... 714/724
2003/0208707 A9*  11/2003  Zerbe et al. ................ 714/715
2004/0128603 A1*   7/2004  Reberga ..................... 714/738
2006/0168483 A1*   7/2006  Sherlock et al. ............. 714/43

* cited by examiner

SYSTEM AND METHOD FOR SYSTEM-ON-CHIP INTERCONNECT VERIFICATION

RELATED APPLICATIONS

The present Application is a Continuation Application of U.S. patent application Ser. No. 10/906,388, filed on Feb. 17, 2005 now U.S. Pat. No. 7,313,738.

BACKGROUND OF THE INVENTION

1. Field of the Invention

The present invention generally relates to an architecture and methodology in which the connectivity between cores, in a system-on-chip, can be verified to prevent connectivity errors, and help in verifying large designs.

2. Description of the Related Art

System-on-chip manufacturers receive system cores and integrate these system cores onto a chip. These system-on-chip manufacturers are concerned about the connections between the system cores and need a system and method to guarantee correct connectivity between the system cores.

As the capacities of integrated circuits continue to increase, more and more circuits are being integrated onto the same die. In the interest of time to market, larger numbers of logic cores are being used on the same die as well. Simple connectivity mistakes will become more likely given this growth in the size of system-on-chip designs.

The traditional solution to this problem is a thorough simulation of the chip at the top level. This solution becomes less feasible as chips grow larger due to an increase in complexity of function and exponential growth in the functional range to be simulated. For example, corner cases will be less likely to be hit in a reasonable amount of time.

IEEE specification 1149.1, otherwise known as Joint Test Action Group, has been used to check connectivity for chips on boards through scan chain structures. In this procedure, patterns are scanned into a chain on the outputs of a device, the signals are clocked into a scan chain on the inputs, and then the results are scanned out and compared against the input pattern. Similar concepts can be applied to on-chip cores. However, unique work must be done for each particular system-on-chip implementation to generate unique scan patterns.

Other conventional methodologies exist to check inter-core connections in processor-based system-on-chips. These conventional methodologies use specific, directed accesses over the processor-to-core interconnect to verify inter-core connectivity. This conventional methodology requires a large amount of simulation resources because the entire chip is being simulated. Further, this conventional methodology is not capable of checking every inter-core connection. Rather, only those inter-core connections that are within the processor interconnect hierarchy are checked.

Therefore, there exists a need to provide checking of all inter-core connections without requiring the testing of the entire chip functionality.

Further, there exists a need for minimizing the amount of simulation.

Additionally, a need exists for checking inter-core connectivity for any core interface in which two cores from a library are connected to one another.

SUMMARY OF THE INVENTION

In view of the foregoing and other exemplary problems, drawbacks, and disadvantages of the conventional methods and structures, an exemplary feature of the present invention is to provide a method and structure which verifies system-on-chip connectivity.

In a first exemplary aspect of the present invention, a system-on-chip interconnect verification circuit includes a first linear feedback shift register coupled to an output interface of a first system-on-chip component, a second linear feedback shift register instantiated in a second system-on-chip component, and a comparator coupled to input interface of the second system-on-chip, and the output of the second linear feedback shift register.

In a second exemplary aspect of the present invention, a method of verifying an interconnect between system-on-chip components on an integrated circuit includes connecting a first linear feedback shift register to an output interface of a first system-on-chip component, instantiating a second linear feedback shift register in a second system-on-chip component, generating a pseudo-random number sequence with the first linear feedback shift register and the second linear feedback shift register using an identical first initial state, and comparing an output of the first linear feedback shift register with an output of the second linear feedback shift register and reporting a miss-compare.

In a third exemplary aspect of the present invention, a system for simulating system-on-chip interconnect verification includes instructions for simulating a first linear feedback shift register coupled to an output interface of a first system-on-chip component, instructions for simulating a second linear feedback shift register coupled to an input interface of a second system-on-chip component, instructions for simulating a comparator coupled to second linear feedback shift register and the input interface of the second system-on-chip, instructions for generating a pseudo-random number sequence with the first linear feedback shift register and the second linear feedback shift register using an identical initial state, and instructions for comparing a simulated output of the first linear feedback shift register with a simulated output of the second linear feedback shift register and reporting a miss-compare.

An exemplary embodiment of this invention provides an architecture and methodology in which the connectivity between cores, in a system-on-chip, can be verified to prevent connectivity errors, and to help in verifying large designs.

An exemplary embodiment of the present invention works at the core interface level, and is independent of other chip structures. Patterns may be generated internally, and no unique work is required to perform checks of the connections.

An exemplary embodiment of the present invention uses Linear Feedback Shift Registers at the inputs and outputs of cores to verify connectivity of integrated digital cores.

In an exemplary embodiment of the present invention two identical Linear Feedback Shift Registers are instantiated, one at the outputs of a core interface, and one at the inputs of the core at the sinks of the connect nets of the outputs. The cores operate in a "connectivity verification" mode, in which the Linear Feedback Shift Registers drives the outputs, cycles through the Linear Feedback Shift Registers states on the clock, and then the outputs of the input Linear Feedback Shift Register are compared against the incoming values each cycle. Miss-compares represent a connection error. Modifications may be made to accommodate addressed bus-structures.

Further, an exemplary embodiment of the present invention only requires the simulation of the linear feedback shift registers, multiplexors, and comparators. There is no need to run a simulation of the full chip functions, and as such, the simulation time is greatly reduced by the present invention.

These and many other advantages may be achieved with the present invention.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF PREFERRED EMBODIMENTS OF THE INVENTION

Referring now to the drawings, and more particularly to FIGS. 1-13, there are shown exemplary embodiments of the method and structures of the present invention.

Figure 1:
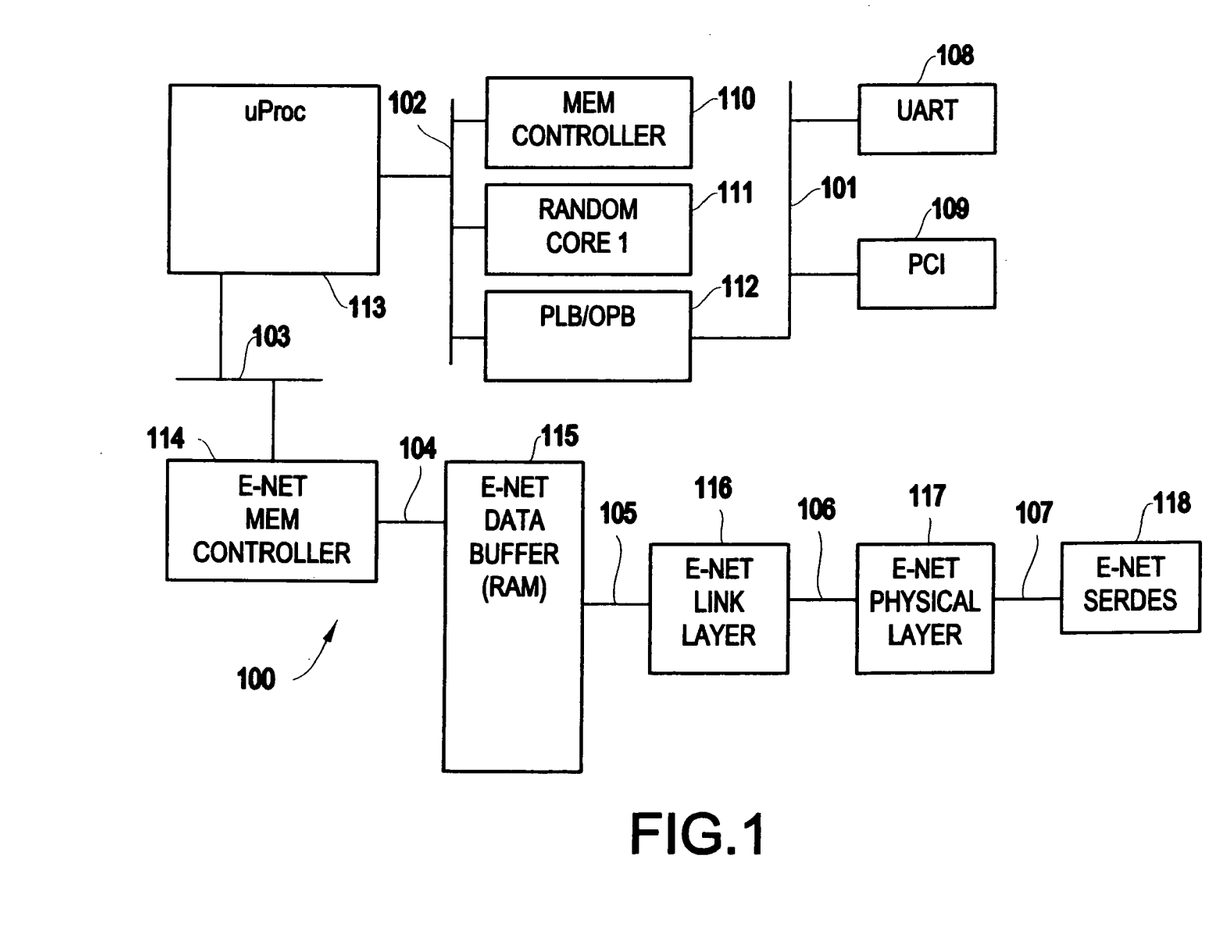
FIG. 1 shows an exemplary system-on-chip 100 having seven inter-core interfaces.

FIG. 1 shows an exemplary system-on-chip 100 having seven inter-core interfaces 101-107 between system cores 108-118. An exemplary embodiment of the present invention is intended to verify the correct connections of the seven inter-core interfaces 101-107 between the system cores 108-118.

An exemplary embodiment of the present invention uses Linear Feedback Shift Registers. These Linear Feedback Shift Registers may include an implementation of a shift register, in which the last bit is fed back to the first bit, and exclusive-OR'd into a select number of other bits. Selection of these bits can be made to produce appropriately long pseudo-random number sequences.

In an exemplary embodiment of the present invention one Linear Feedback Shift Register is created and the outputs from its registers are connected to a core's outputs. An identical Linear Feedback Shift Register is created on the target of the interface. Every core with a specific type of interface should have the same Linear Feedback Shift Register, with the same bits of the Linear Feedback Shift Register connected to the same pins.

If the interface for a core has some configurability to it, such as, for example, optional pins or varying bus-widths, then the Linear Feedback Shift Register should be large enough to accommodate every configuration of that core, with the same bits of the Linear Feedback Shift Register connected to the same pins, regardless of instantiated configuration.

The Linear Feedback Shift Registers for an input/output pair should be seeded with the same seed value, with care such that if there are multiple instantiations of the interface, then each interface gets a unique seed value. Improperly connected pins will be attached to different bits of either the same Linear Feedback Shift Register or a different Linear Feedback Shift Register, and the possibility of a substantially long bit sequence matching is extremely small.

Figure 2:
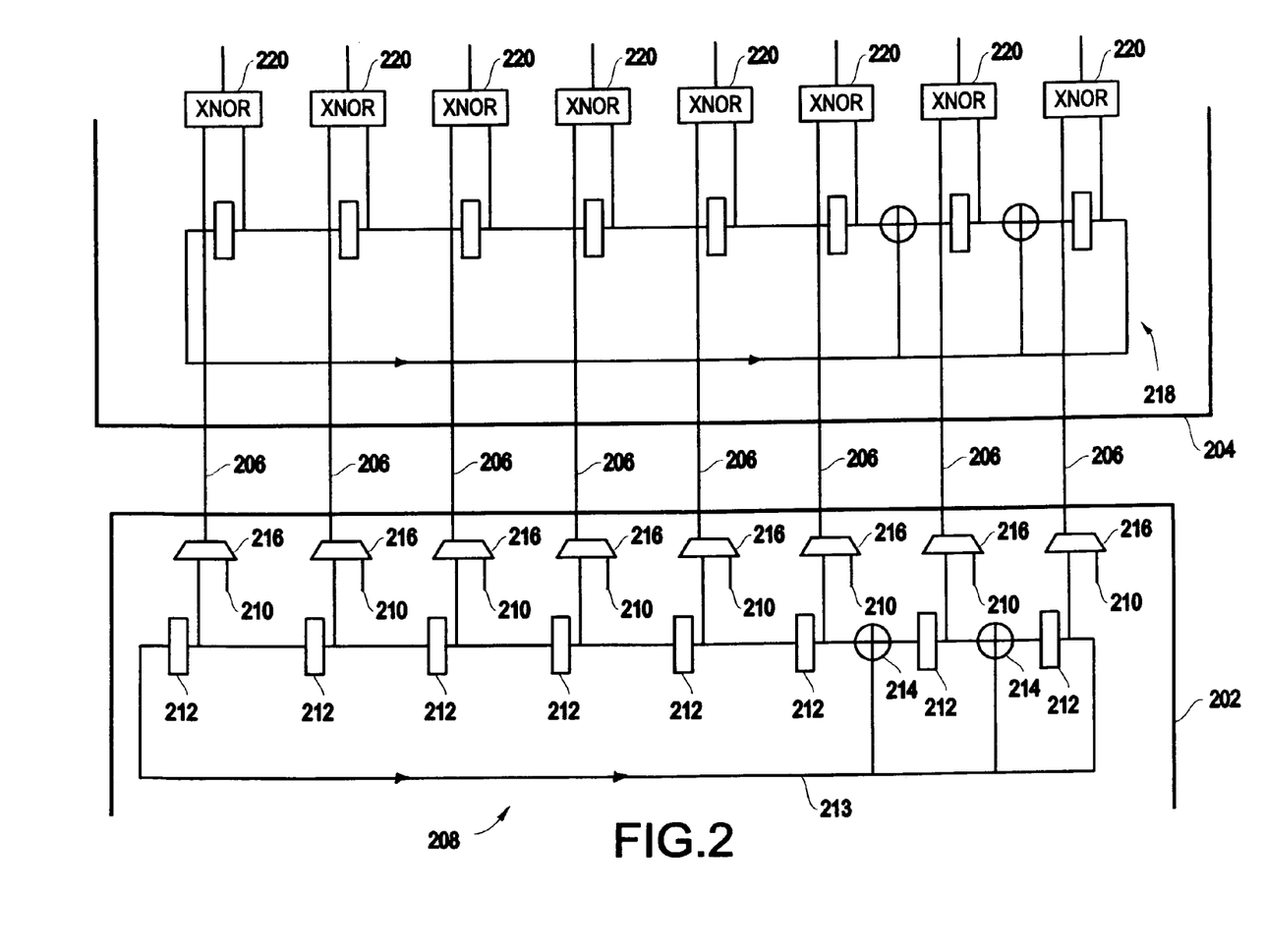
FIG. 2 illustrates a first exemplary embodiment of a system-on-chip interconnect verification circuit 200 in accordance with the present invention.

FIG. 2 illustrates a first exemplary embodiment of the present invention. A first core 202 is inter-connected with second core 204 via inter-core connections 206. A first linear feedback shift register 208 is formed at the outputs 210 from the first core 202. The first linear feedback shift register 208 includes a serially connected series of shift registers 212 (e.g., flip-flops) and Exclusive-OR logic elements 214. The output of the last shift register 212 is fed-back along feedback connection 213 to the first shift register 212. The Exclusive-Or logic elements 214 receive input from the fed-back output of the last shift register and provides an exclusive-or'd output to the last to shift registers 212.

The output of each shift register 212 is provided to a corresponding multiplexor 216. The multiplexors 216 determine which of the output from each shift register 212 or the normal pin function from the outputs 210 of the normal core operation are provided to the inter-core connections 206.

The second linear feedback shift register 218 is formed at the inputs to the second core 204. The second linear feedback shift register 218 is identical to the first linear feedback shift register 208.

A series of Exclusive-NOR logic elements 220 are connected to the inter-core connections 206 and the corresponding outputs from the shift registers of the second linear feedback shift register 218. The outputs from the Exclusive-NOR logic elements 220 are examined to determine whether there is any error in the inter-core connections.

In accordance with an exemplary embodiment of the present invention, the seed value for the Linear Feedback Shift Registers may be determined based upon a simulation such that each unique interface is seeded with a unique value. This logic may be included in the design source and is flagged for deletion in the synthesis flow.

Figure 3:
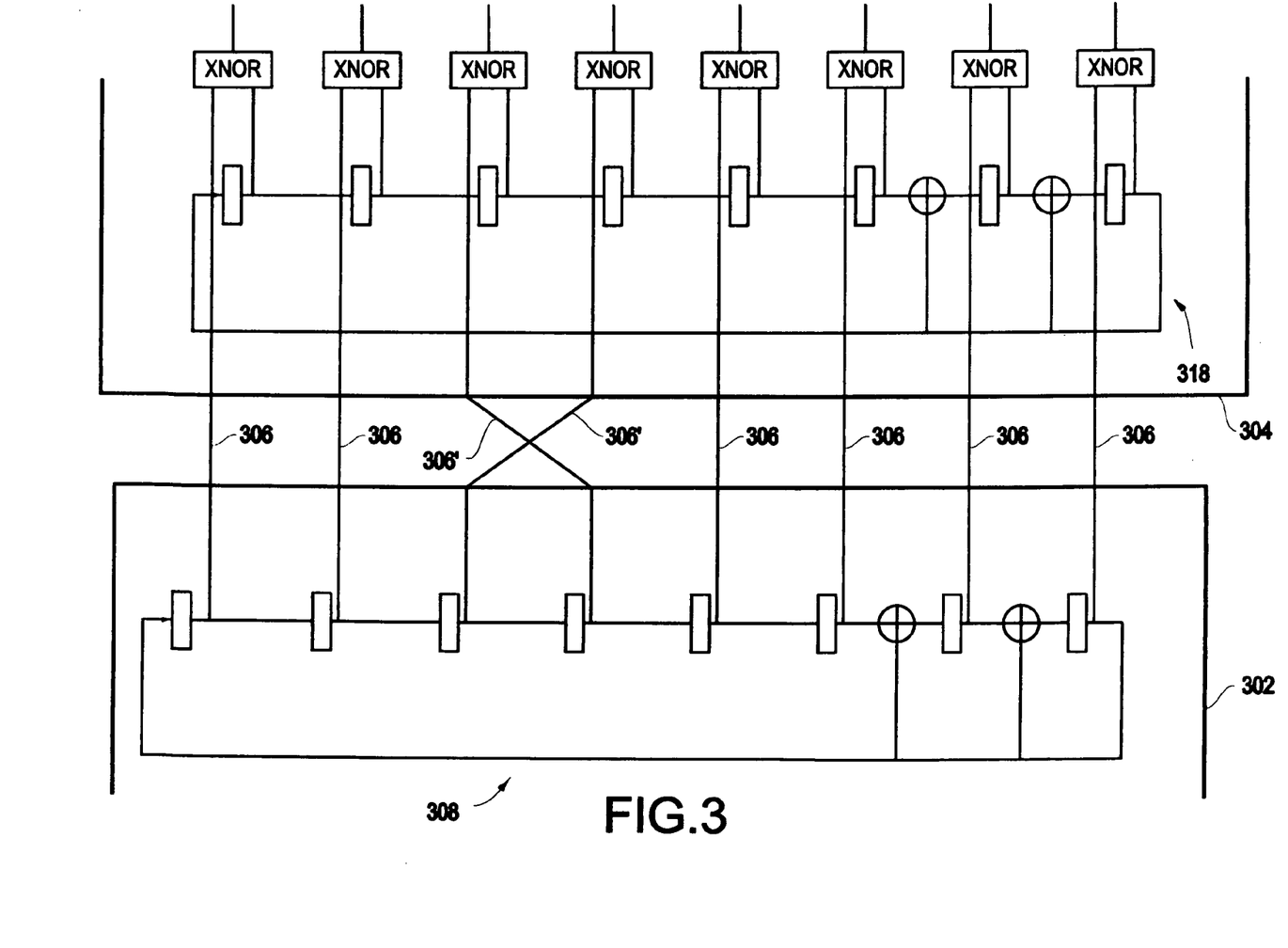
FIG. 3 illustrates an example of a connection error on an 8-bit interface of inter-core connections 306.

FIG. 3 illustrates an example of a connection error on an 8-bit interface of inter-core connections 306. The first core 302 is connected to the second core 304 through the inter-core connections 306. However, in contrast to the inter-core connections 206 illustrated by FIG. 2, the inter-core connections 306 include cross-connected inter-core connections 306'.

In an exemplary operation of the present invention to check the inter-core connections 306, the Linear Feedback Shift Registers 308 and 318 are seeded with 0xFF. Table 1 below illustrates how the connection sequence identifies the error. On the fifth, seventh, and eighth cycles the compare outputs are non-zero, indicating a connection error on the respective bits.

TABLE 1

| Output values (a) | Inputs seen (b) | Input LFSR state (c) | Compare output (d) |
|---|---|---|---|
| 1111_1111 | 1111_1111 | 1111_1111 | 1111_1111 |
| 1111_1100 | 1111_1100 | 1111_1100 | 1111_1111 |
| 0111_1110 | 0111_1110 | 0111_1110 | 1111_1111 |
| 0011_1111 | 0011_1111 | 0011_1111 | 1111_1111 |
| 1001_1100 | 1010_1100 | 1001_1100 | 1100_1111 |
| 0100_1110 | 0100_1110 | 0100_1110 | 1111_1111 |
| 0010_0111 | 0001_0111 | 0010_0111 | 1100_1111 |
| 1001_0000 | 1010_0000 | 1001_0000 | 1100_1111 |
| 0100_1000 | 0100_1000 | 0100_1000 | 1111_1111 |

A second exemplary embodiment of the present invention provides secondary models (i.e. separate VHDL architectures) that are created alongside the source, in which the same Linear Feedback Shift Registers may be instantiated. These secondary models may be simulated in the design to verify connectivity, and this simulation will be faster. Since these are different models, they will not be included in synthesis.

A third exemplary embodiment of the present invention verifies connectivity on shared bus networks. If all devices on a shared signal can drive and sample, then only one connection sequence needs to be performed. However, if there is more than one device that can drive, but not sample, then a separate connection sequence will need to be performed for each such device.

Figure 4:
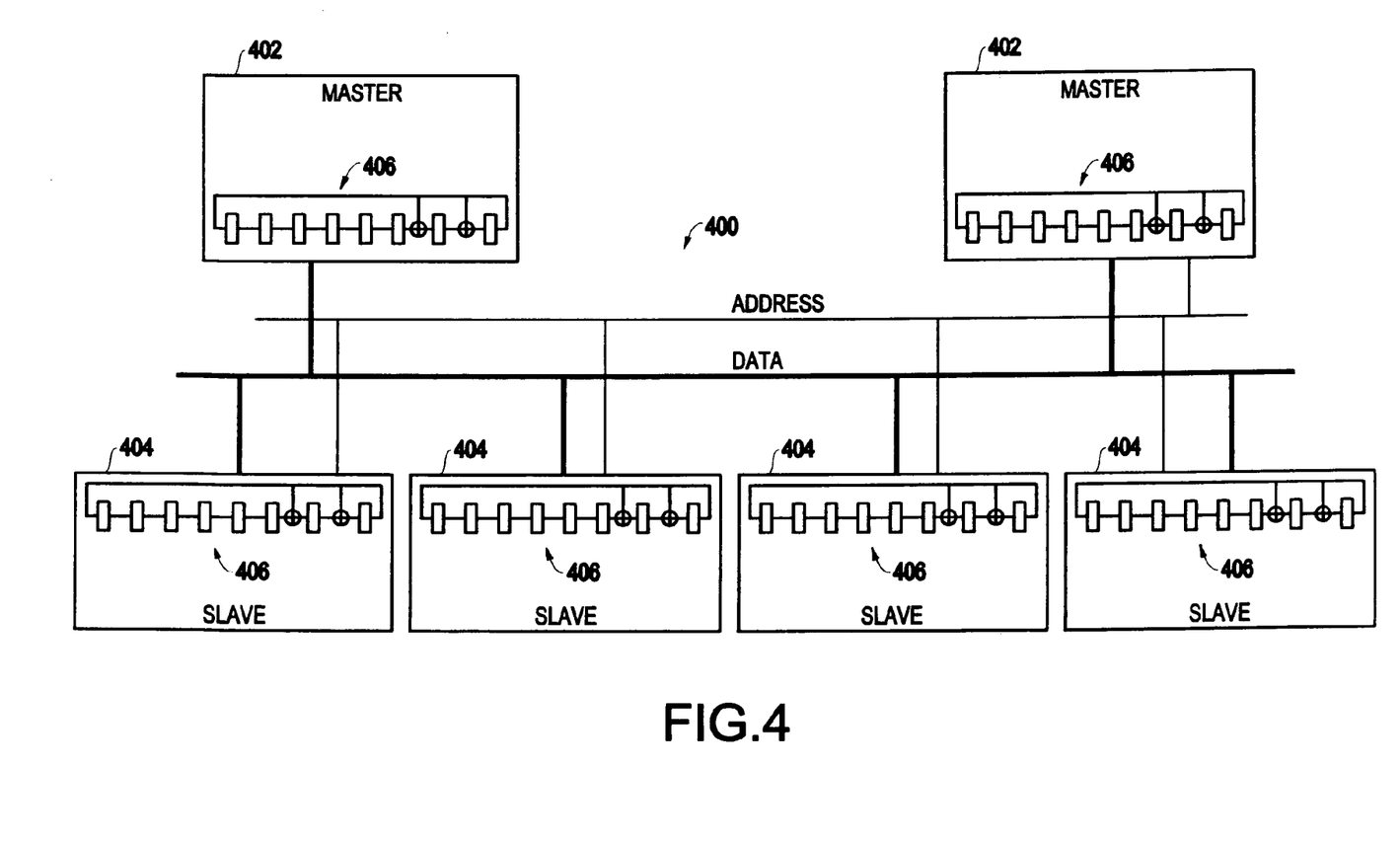
FIG. 4 shows an example of a multiple device bus interface 400.

In this regard, FIG. 4 shows an example of a multiple device bus interface 400. The multiple device bus interface 400 interconnects a pair of master devices 402 and four slave devices 404. Assume for this example that the master devices 402 can only drive the "address" line of the interface 400, and not sample it (e.g., a tri-stateable output). Linear feedback shift registers 406 are provided for each core device, i.e. each master device 402 and each slave device 404. Then to check the connectivity using this exemplary embodiment of the present invention, two runs may be performed, the first run when one of the master devices 402 drives the interface 400 and the second run when the other one of the master devices 402 drives the interface 400.

In cases where devices are only partially connected, yet another exemplary embodiment of the present invention may check connectivity by only considering the compare bits of pins that are connected.

Figure 5:
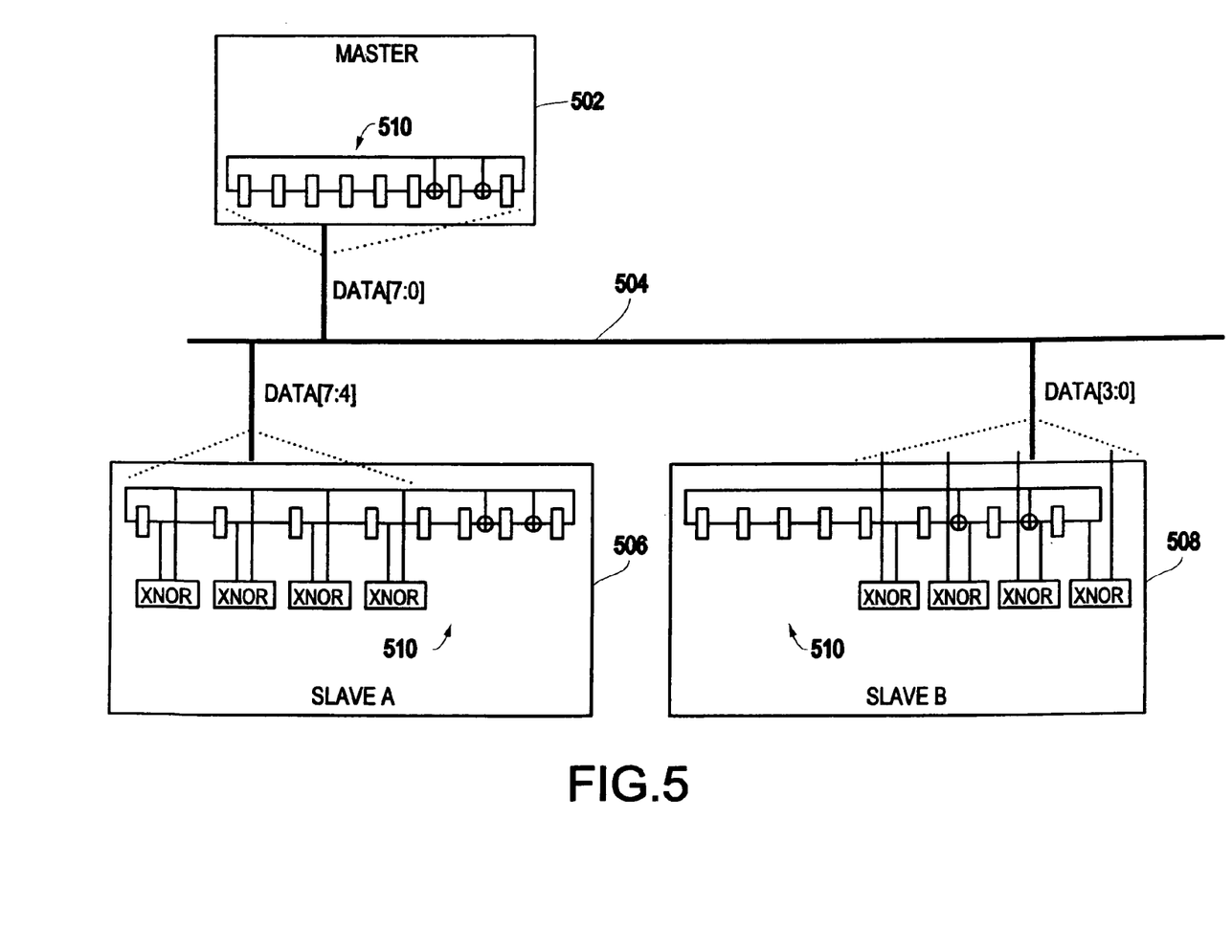
FIG. 5 shows a master device 502 driving an 8 bit bus 504.

For example, FIG. 5 shows a master device 502 driving an 8 bit bus 504. The bus 504 is connected to slave A 506 which is connected to the upper 4 bits of the data bus, and slave B 508 which is connected to the lower 4 bits. A 8-bit Linear Feedback Shift Register 510 for each of the master device 502, slave A 506 and slave B 508 is used to check connectivity. When the check is run, the comparison is only checked on the upper bits of slave A 506, and on the lower bits of slave B 508.

While this exemplary embodiment was illustrated with reference to an eight bit bus, the present invention may be used on an interface having any width, as well as any number of dropped connections.

Figure 6:
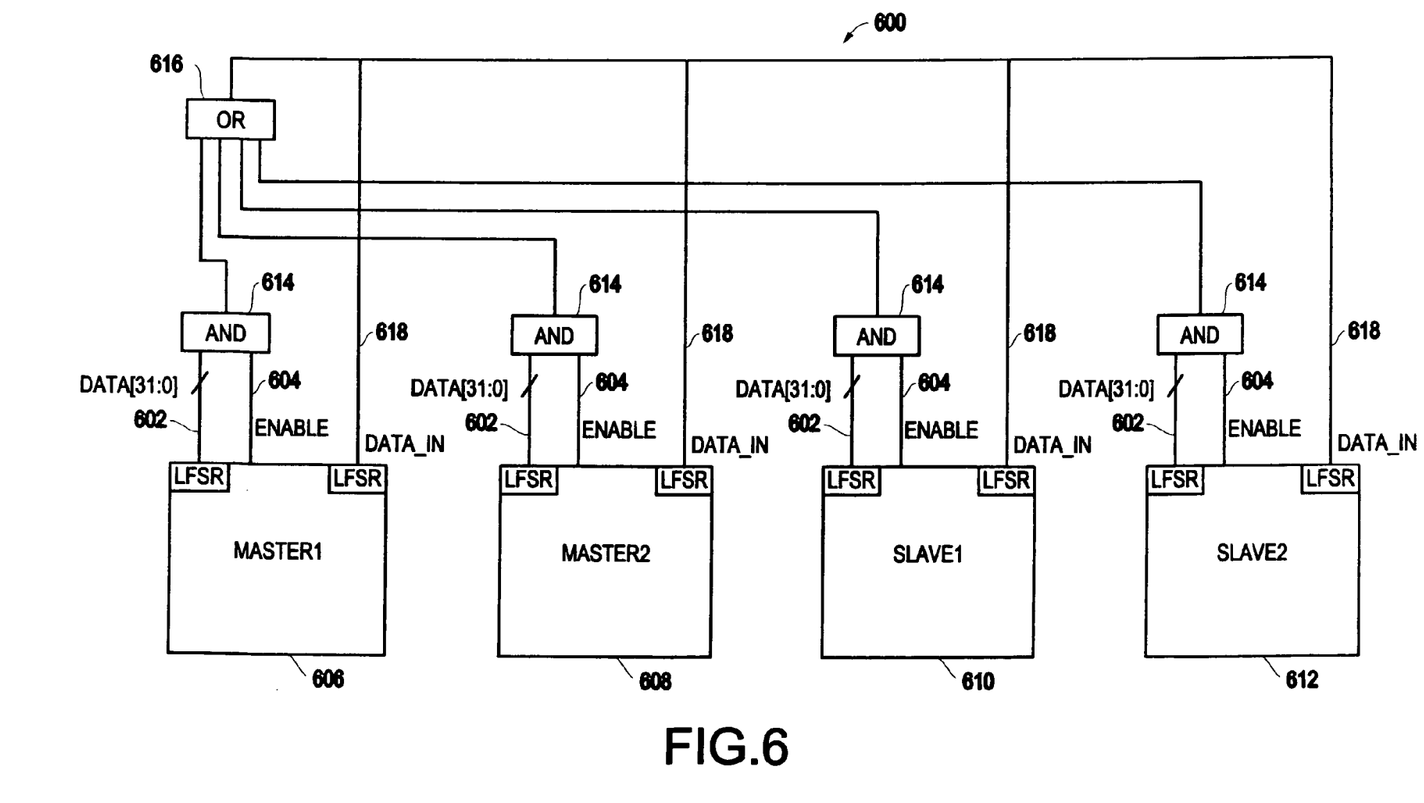
FIG. 6 shows an example of a bus architecture 600 having a non-tri-state architecture.

For cases in which the bus does not have a tri-state architecture, additional control may be supplied. In these cases, master and slave cores may be connected with some additional glue logic to gate off outputs of cores to prevent multiple driving. FIG. 6 shows an example of a bus architecture 600 having a non-tri-state architecture.

In this exemplary embodiment, the data bus 602 and enable 604 from each core 606, 608, 610, and 612 are connected to an AND logic element 614. Each AND logic element 614 is, in turn, connected to an OR logic element 616. The output of the OR logic element is connected to "data_in" 618 of each core 606, 608, 610, and 612. Therefore, the data bus 602 is ANDed with an enable 604 from each core, and subsequently ORed to form the net that will be input 618 to each core 606, 608, 610, and 612.

To check the connectivity of this architecture 600, the enable output 604 is overridden and set to one for the core whose driving connectivity is being checked. The other enable outputs 604 are set to zero. For this exemplary embodiment this step is repeated four times, once for each device core 606, 608, 610, and 612 that is capable of "driving" the bus. Note that the connectivity of the enable pin 604 itself is not checked.

The above-described exemplary embodiments may rely on software control of the simulation to set the Linear Feedback Shift Register values and to start and stop checking. However, control of the Linear Feedback Shift Registers may be handled entirely in hardware as illustrated by the following description of exemplary embodiments.

Figure 7:
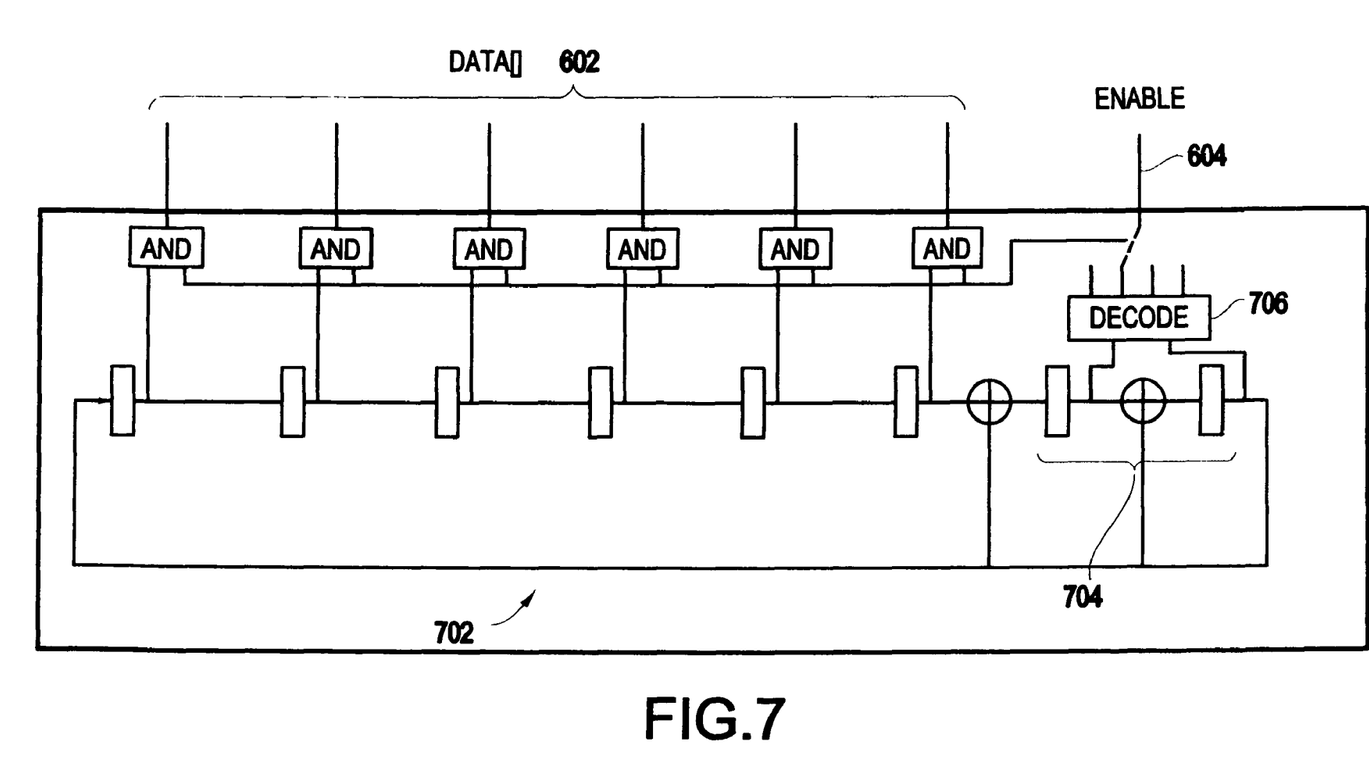
FIG. 7 illustrates an exemplary linear feedback shift register 702 for the non-tri-state bus architecture of FIG. 6.

Given the above non-tri-state architecture, as illustrated by FIG. 7, the enable pin 604 along with the multiple masters may be checked by extending the Linear Feedback Shift Register 702 bit-width by two bits 704, and using the extra two bits 704 to decode into the enable signal on the output signals using decoder 706. This decoded value may be driven onto the enable signal 604, which gates off the outputs 602 from the other device cores. The decode bit to which the enable signal is applied may be determined through module parameters.

At the top chip level, the parameters are chosen such that no two cores are connected to the same decode bit. Note that the size of the decoder should be large enough to accommodate the maximum number of devices allowed on one interface. The input Linear Feedback Shift Register is extended by the same two bits, but only the original bits are compared with the input signals.

Figure 8:
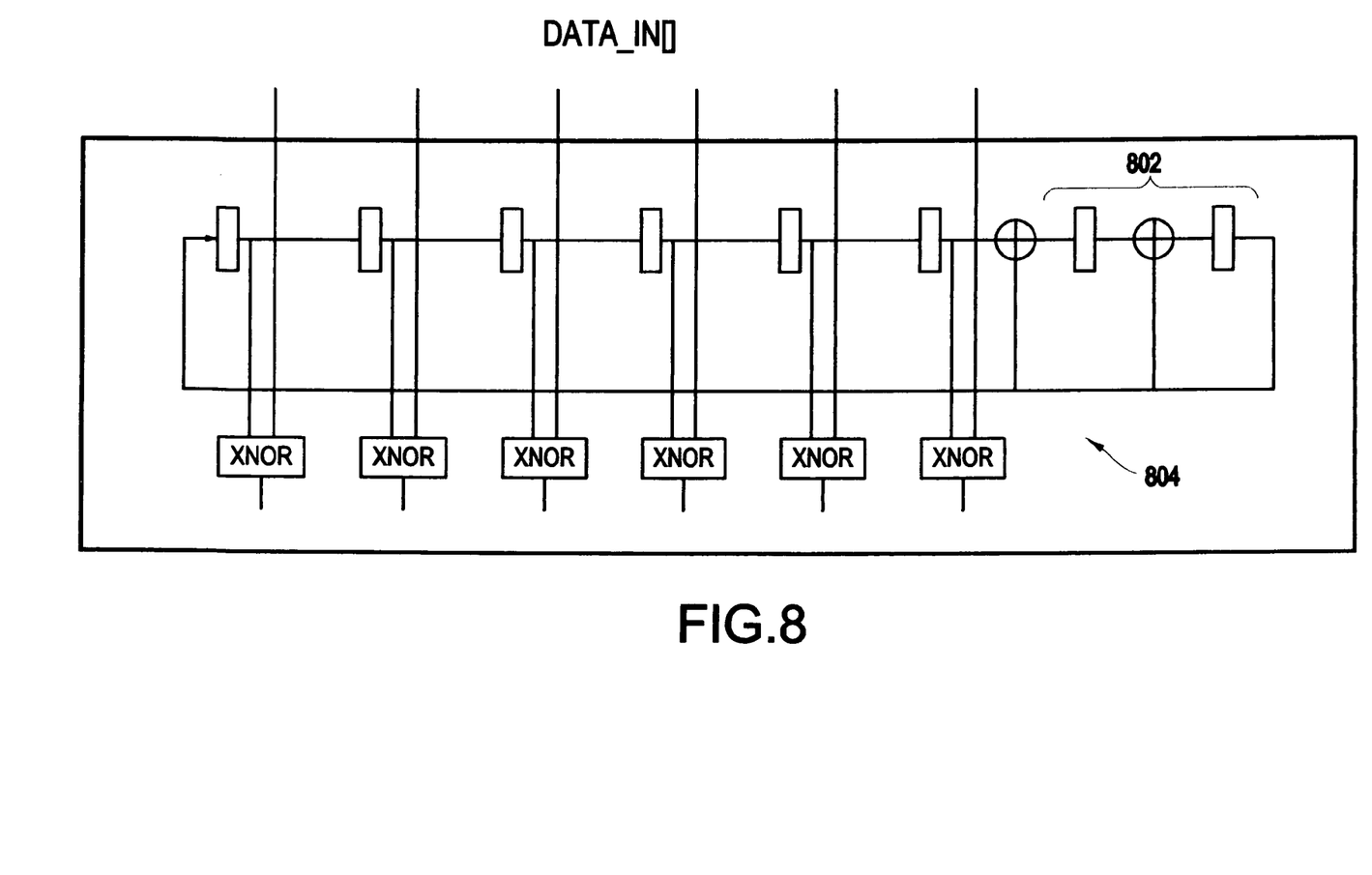
FIG. 8 illustrates how an input comparison may be implemented for the non-tri-state architecture of FIG. 6 in accordance with an exemplary embodiment of the present invention.

FIG. 8 illustrates how an input comparison may be implemented for the non-tri-state architecture in accordance with this exemplary embodiment of the present invention. Note that the bottom two bits 802 of the Linear Feedback Shift Register 804 are not compared.

Figure 9:
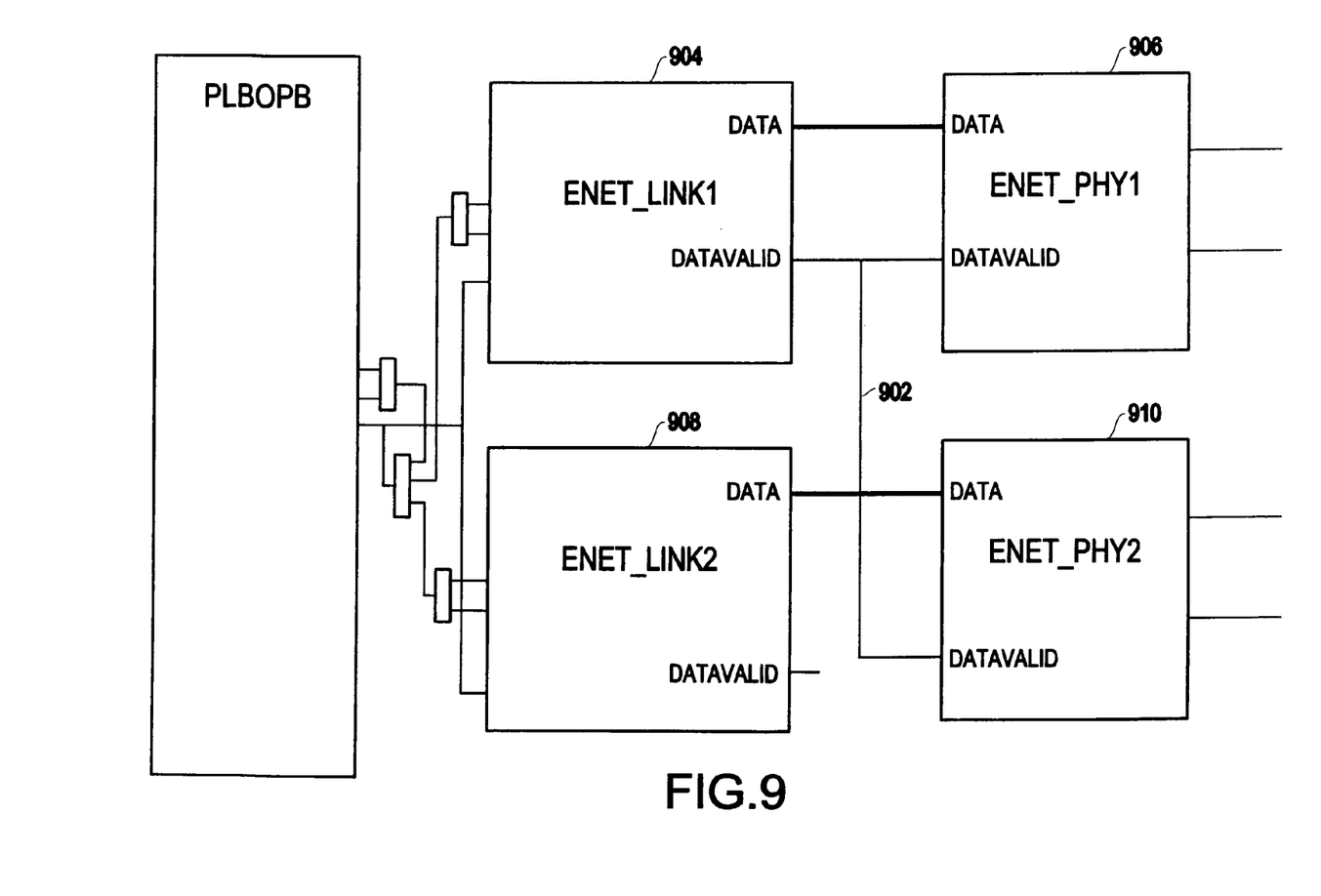
FIG. 9 illustrates multiple instantiations of the same interface on a system-on-chip.

At the chip level, there may be multiple instantiations of the same interface as illustrated in FIG. 9. FIG. 9 illustrates enet_link 1 core 904 interfaced with enet_phy 1 core 906 and enet_link2 core 908 interfaced with enet_phy2 core 910. However, FIG. 9 illustrates an invalid pin connection 902 across disparate interfaces and this invalid connection 902 connects pins that would be correct if they were on the same interface.

An exemplary embodiment of the present invention may address this situation. Given the two enet link/phy interfaces, if a bad connection was made between the "datavalid" pins, then if both Linear Feedback Shift Registers (not shown) are started with the same seed value, this bad connection will not be detected.

There are multiple ways to address the false positive results. One is to override the seed value using simulation control software. Another is to implement the initial seed values as overriding parameters in the design source, such that at the top level, an automatically generated list of parameter overrides sets the seed values, and these types of false positives are resolved.

Another exemplary embodiment of the present invention uses this same idea to verify connectivity of cores on the chip boundary. Cores connecting off chip can have the core-to-chip pin connection tested through use of simulation models containing Linear Feedback Shift Registers for connectivity testing. The chip may be simulated connected to these models, which then verifies the connectivity of the boundary cores to the chip pins.

Figure 10:
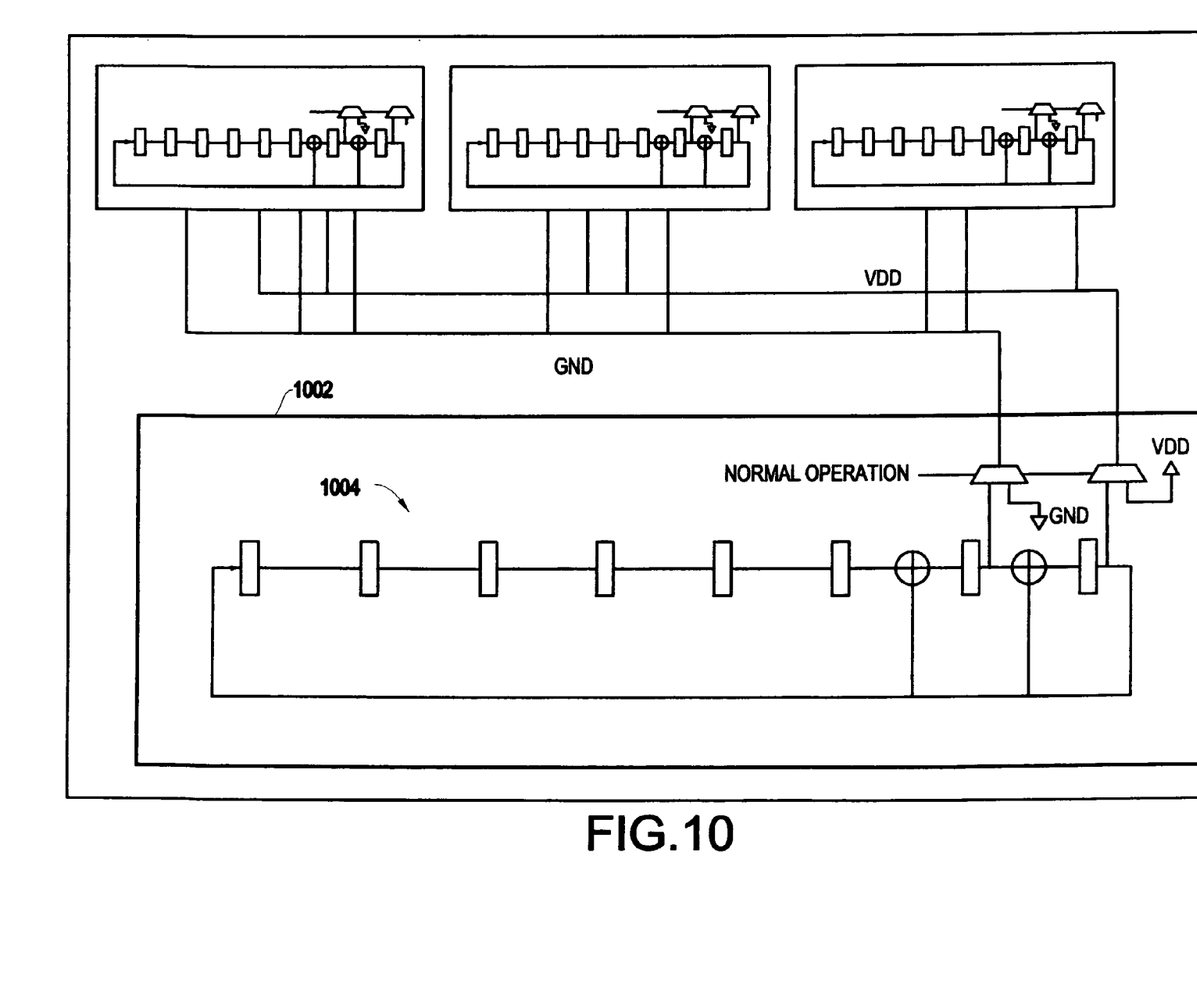
FIG. 10 illustrates an exemplary embodiment of the present invention for checking pin connections that are specified to be connected to power or ground.

An exemplary embodiment of the present invention may also be used to check pin connections that are specified to be connected to power or ground as illustrated by FIG. 10. In this exemplary embodiment a special core 1002 drives power VDD and ground GND signals. Under normal operation, this core 1002 simply outputs constant one and zero. Under the connection verification mode, the core 1002 selects its outputs as bits from the Linear Feedback Shift Register 1004 in a manner that may be similar to that described above. The same Linear Feedback Shift Register must exist in the sinks of the power and ground nets. Each bit that is supposed to be tied to zero is checked against the Linear Feedback Shift Register bit driven on the GND wire. Likewise for each bit that is supposed to be tied to one (i.e. VDD).

Figure 11:
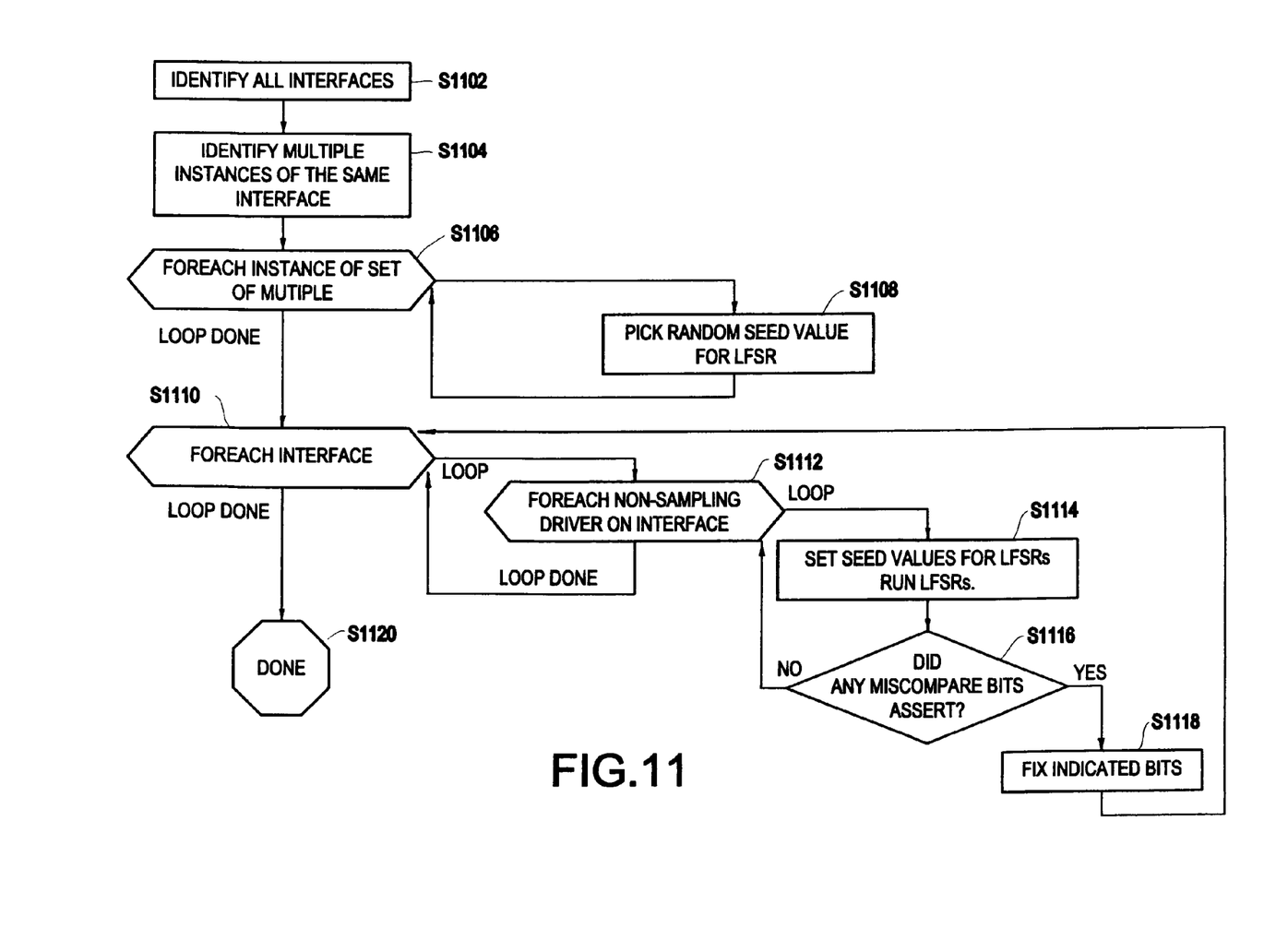
FIG. 11 is a flowchart illustrating an exemplary embodiment of a control routine for checking system-on-chip pin connections.

FIG. 11 illustrates an exemplary control routine for checking inter-core connections in accordance with the present invention. The control routine starts at step S1102 where all interfaces on the chip are identified and the routine continues to step S1104. In step S1104, the control routine identifies multiple interfaces of the same interface and continues to step S1106.

In step S1106, for each instance of the set of multiple instances of the same interface the control routine executes step S1108. In step S1108, the control routine picks a random seed value for each linear feedback shift register.

After the loop from step S1106 is completed, the control routine continues to step S1110. In step S1110 a loop is initiated for each interface on the chip that continues with step S1112. In step S1112, the control routine initiates a sub-loop for each non-sampling driver on the current interface that starts at step S1114.

In step S1114, the control routine sets seed values for the linear feedback shift registers, operates the linear feedback shift register and then continues to step S1116. In step S1116 the control routine determines whether any miss-compare bits were asserted. If in step S1116, the control routine determines that a miss-compare bit was asserted, the control routine continues to step S1118. In step S1118, the control routine fixes the miss-compare bits that were asserted and returns to step S1110.

On the other hand, if in step S1116, the control routine determines that no miss-compare bit was asserted, then the control routine returns to step S1112.

After the control routine processes each interface at step S1110, the control routine finishes at step S1120.

Figures 12, 13:
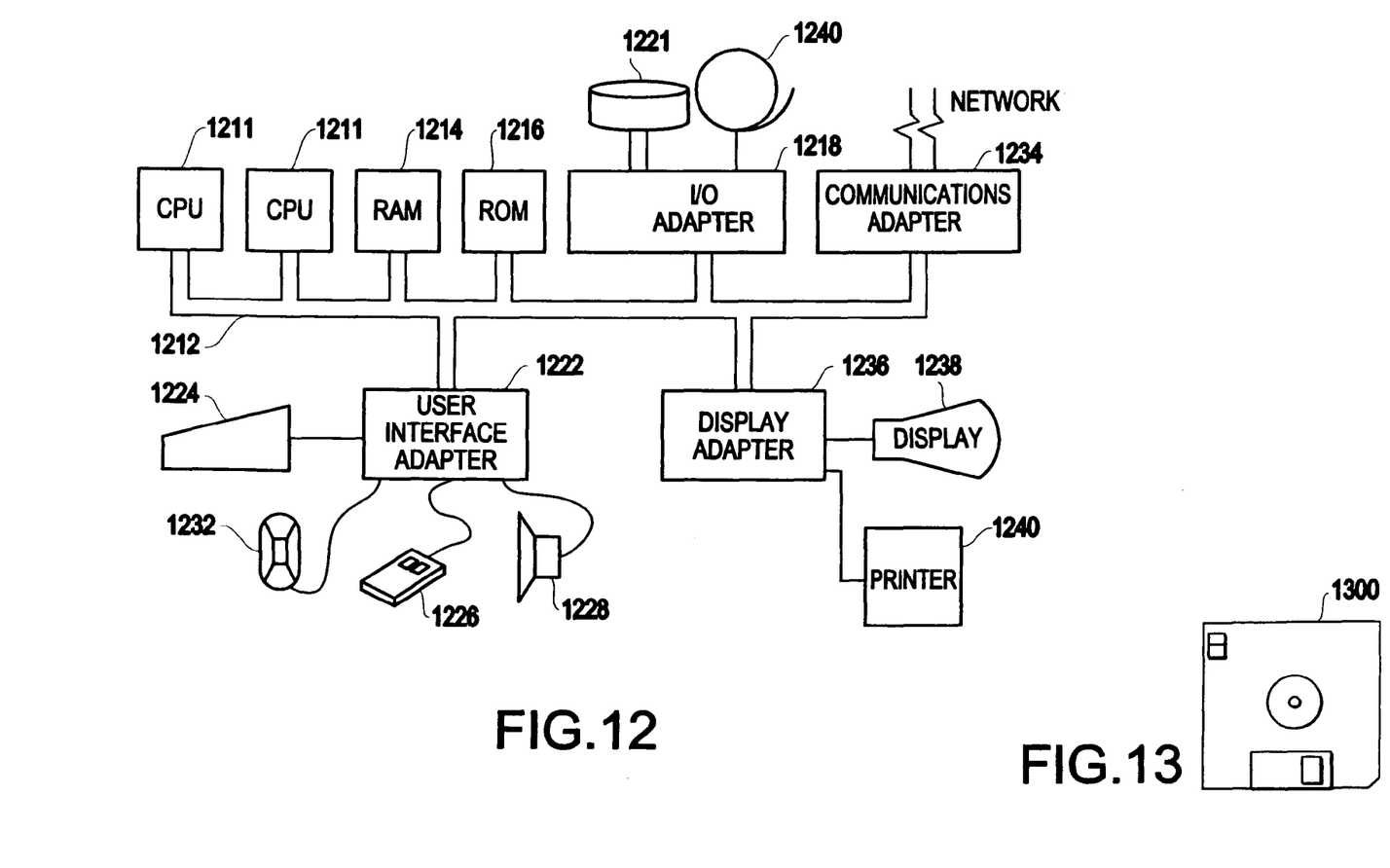
FIG. 12 illustrates an exemplary hardware/information handling system 1200 for incorporating the present invention therein.
FIG. 13 illustrates a signal bearing medium 1300 (e.g., storage medium) for storing steps of a program of a method according to the present invention.

FIG. 12 illustrates a typical hardware configuration of an information handling/computer system for use with the invention and which preferably has at least one processor or central processing unit (CPU) 1211.

The CPUs 1211 are interconnected via a system bus 1212 to a random access memory (RAM) 1214, read-only memory (ROM) 1216, input/output (I/O) adapter 1218 (for connecting peripheral devices such as disk units 1221 and tape drives 1240 to the bus 1212), user interface adapter 1222 (for connecting a keyboard 1224, mouse 1226, speaker 1228, microphone 1232, and/or other user interface device to the bus 1212), a communication adapter 1234 for connecting an information handling system to a data processing network, the Internet, an Intranet, a personal area network (PAN), etc., and a display adapter 1236 for connecting the bus 1212 to a display device 1238 and/or a printer 1240.

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

This signal-bearing media may include, for example, a RAM contained within the CPU 1211, as represented by the fast-access storage for example. Alternatively, the instructions may be contained in another signal-bearing media, such as a magnetic data storage diskette 1300 (FIG. 13), directly or indirectly accessible by the CPU 1211.

Whether contained in the diskette 1300, the computer/CPU 1211, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media. In an illustrative embodiment of the invention, the machine-readable instructions may comprise software object code, compiled from a language such as "C", etc.

While the invention has been described in terms of several exemplary embodiments, those skilled in the art will recognize that the invention can be practiced with modification. For example, the Linear Feedback Shift Registers used in the above-descriptions are based on the polynomial 0×07 for demonstration purposes only and any Linear Feedback Shift Register may be used and still practice the invention.

Further, it is noted that, Applicant's intent is to encompass equivalents of all claim elements, even if amended later during prosecution.

What is claimed is:

1. A system-on-chip interconnect verification circuit, comprising:
    a first linear feedback shift register coupled to an interface to an interconnect of a first core of said system-on-chip;
    a comparator coupled to said interconnect through a first input of said comparator;
    a second linear feedback shift register coupled to a second input of said comparator; and
    a decode circuit connected to at least one of the first linear feedback shift register and the second linear feedback shift register,
    wherein said interconnect is coupled to an interface of a second core of said system-on-chip.

2. The circuit of claim 1, further comprising a multiplexer coupled to the first linear feedback shift register and the interface of the first system-on-chip core.

3. The circuit of claim 1, wherein the linear feedback shift registers each comprise a linear array of shift registers where the last bit in the array is fed back to the first bit, and
    wherein the comparator comprises a plurality of comparators, each one of the plurality of comparators verifying a signal received from a corresponding shift register of the linear array of shift registers of the first linear feedback shift register with a signal received from a corresponding shift register of the linear array of shift registers of the second linear feedback shift register.

4. The circuit of claim 1, wherein each one of the first and second linear feedback shift registers comprises a plurality of shift registers, an output of each one of the shift registers of the first linear feedback shift register is compared by the comparator to a corresponding shift register of the second linear feedback shift register.

5. The circuit of claim 4, further comprising a first input of each one of a plurality of multiplexers connected to the output of each one of the shift registers of the first linear feedback shift register, a second input of each one of the plurality of multiplexers connected to an output of an operation of the first core, and an output of each one of the multiplexers provided to the comparator for comparison.

6. The circuit of claim 1, wherein:
the first linear feedback shift register comprises a plurality of shift registers, each coupled to the interface to a plurality of inter-core connections of the interconnect of a first core of said system-on-chip;
the comparator comprises a plurality of sub-comparators, each coupled to a corresponding one of the inter-core connections through a first input of the sub-comparators; and
the second linear feedback shift register comprises a plurality of shift registers, each coupled to a second input of the corresponding sub-comparators to compare a signal from the corresponding one of the inter-core connections.

7. The circuit of claim 1, wherein said comparator compares a signal derived from the first linear feedback shift register received directly from said interconnect to a signal from the second linear feedback shift register.

8. The circuit of claim 1, wherein said comparator compares a plurality of output signals from the first linear feedback shift register, transmitted over a plurality of corresponding interconnect lines of said interconnect, with a plurality of output signals from the second linear feedback shift register corresponding to the output signals of the first linear feedback shift register to verify each one of the interconnect lines at the same time.

9. A method of verifying an interconnect between system-on-chip cores on an integrated circuit, the method comprising:
connecting a first linear feedback shift register to an interface to said interconnect of a first core of the system-on-chip;
connecting a second linear feedback shift register to an interface to said interconnect of a second core of said system-on-chip;
generating a pseudo-random number sequence with the first linear feedback shift register and the second linear feedback shift register using an identical first initial state;
comparing an output of the first linear feedback shift register with an output of the second linear feedback shift register and reporting a miss-compare; and
connecting a decode circuit to at least one of the first linear feedback shift register and the second linear feedback shift register.

10. The method of claim 9, further comprising multiplexing said interface of the first system-on-chip core with the interface of said second system-on-chip core to operate in connectivity verification mode, such that the first linear feedback shift register drives the interface of the first system-on-chip core.

11. The method of claim 9, wherein each of said first linear feedback shift register and said second linear feedback shift register comprises:
a linear array of shift registers including a last bit being fed back to a first bit; and
exclusive-OR logic elements connected to said linear array of shift registers, and
wherein said generating a pseudo-random sequence comprises seeding each of first linear feedback shift register and said second linear feedback shift register with a same seed value.

12. The method of claim 9, further comprising:
connecting a first AND logic element to the first core;
connecting a second AND logic element to the second core;
connecting an OR logic element to the first AND logic element, the second AND logic element, the first core, and the second core;
overriding an enable output for one of the first core and the second core; and
connecting an array of AND logic elements to at least one of the first linear feedback shift register and the second linear feedback shift register.

13. The method of claim 9, wherein each one of the first and second linear feedback shift registers comprises a plurality of shift registers, and said comparing further comprising of comparing an output of each one of the shift registers of the first linear feedback shift register by the comparator to a corresponding shift register of the second linear feedback shift register.

14. The method of claim 9, further comprising:
connecting a first AND logic element to the first core;
connecting a second AND logic element connected to the second core;
connecting an OR logic element to the first AND logic element, the second AND logic element, the first system-on-chip core, and the second system-on-chip core, and overriding an enable output for one of the first system-on-chip core and the second system-on-chip core; and
connecting an array of AND logic elements to at least one of the first linear feedback shift register and the second linear feedback shift register.

15. A computer readable medium storing a set of instructions executable by a processing unit to execute a method for simulating a system-on-chip interconnect verification, the method comprising:
simulating a first linear feedback shift register coupled to a multiplexer;
simulating a comparator including a first input coupled to said multiplexer through said interconnect;
simulating a second linear feedback shift register coupled to a second input of said comparator;
generating a pseudo-random number sequence with the first linear feedback shift register and the second linear feedback shift register using an identical initial input; and
comparing an output of the first linear feedback shift register with an output of the second linear feedback shift register through the simulated comparator and reporting a miss-compare, wherein said interconnect connects cores on the same system-on-chip; and
simulating a decode circuit coupled to at least one of the first linear feedback shift register and the second linear feedback shift register.

16. The computer readable medium of claim 15, wherein the method further comprises:
multiplexing said interface of a first system-on-chip core with the interface of a second system-on-chip core to operate in connectivity verification mode, such that the first linear feedback shift register drives the interface of the first system-on-chip core.

17. The computer readable medium of claim 15, wherein each of said first linear feedback shift register and said second linear feedback shift register comprises:
- simulating a linear array of shift registers having a last bit being fed back to the first bit; and
- simulating exclusive-OR logic elements connected to said linear array of shift registers, and
- wherein said generating a pseudo-random sequence comprises seeding each of first linear feedback shift register and said second linear feedback shift register with a same seed value.

18. A computer readable medium storing a set of instructions executable by a processing unit to execute a method for simulating a system-on-chip interconnect verification, the method comprising:
- simulating a first linear feedback shift register coupled to a multiplexer;
- simulating a comparator including a first input coupled to said multiplexer through said interconnect;
- simulating a second linear feedback shift register coupled to a second input of said comparator;
- generating a pseudo-random number sequence with the first linear feedback shift register and the second linear feedback shift register using an identical initial input;
- comparing an output of the first linear feedback shift register with an output of the second linear feedback shift register through the simulated comparator and reporting a miss-compare, wherein said interconnect connects cores on the same system-on-chip;
- simulating a first AND logic element connected to a first system-on-chip core;
- simulating a second AND logic element connected to a second system-on-chip core;
- simulating an OR logic element connected to the first AND logic element, the second AND logic element, the first system-on-chip core, and the second system-on-chip core, overriding an enable output for one of the first system-on-chip core and the second system-on-chip core; and
- simulating connecting an array of AND logic elements to at least one of the first linear feedback shift register and the second linear feedback shift register.

* * * * *